(12) United States Patent
Hayashi

(10) Patent No.: US 6,403,924 B1
(45) Date of Patent: Jun. 11, 2002

(54) APPARATUS FOR AND METHOD OF HEAT TREATMENT AND SUBSTRATE PROCESSING APPARATUS

(75) Inventor: Toyohide Hayashi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 09/686,239

(22) Filed: Oct. 11, 2000

(30) Foreign Application Priority Data

Oct. 12, 1999 (JP) .......................................... 11-289057

(51) Int. Cl.⁷ ................................................. F27B 5/14
(52) U.S. Cl. ........................ 219/390; 219/405; 219/411; 48/724; 48/725; 392/416; 414/935; 414/939
(58) Field of Search ................................ 219/390, 405, 219/411; 392/416, 418; 118/724, 725, 50.1; 414/935, 936, 937, 939, 941

(56) References Cited

U.S. PATENT DOCUMENTS 5,592,581 A * 1/1997 Okase ........................ 392/418
6,080,969 A * 6/2000 Goto et al. ............... 219/444.1
6,246,030 B1 * 6/2001 Matsuyama ................. 219/390

* cited by examiner

*Primary Examiner*—Teresa Walberg
*Assistant Examiner*—Shawntina Fuqua
(74) *Attorney, Agent, or Firm*—Ostrolenk, Faber, Gerb & Soffen, LLP

(57) ABSTRACT

A heat treatment apparatus and a substrate processing apparatus having the heat treatment apparatus incorporated therein are provided. Nitrogen gas flowing through a gas inlet (16) into a chamber (15) is diffused by a diffusion filter (18) to produce a uniform laminar flow in a horizontal direction, and the laminar flow exits from the chamber (15) through an opening (41) to prevent outside air from entering the chamber (15), thereby maintaining a low oxygen concentration atmosphere within the chamber (15). Performing heat treatment upon a substrate by a heater (30) within the chamber (15) prevents oxygen molecules from being introduced into a film on the substrate to provide a low dielectric constant of the film. Within the chamber (15), the substrate (W) held on a transport arm (60) in which a coolant is circulated is rapidly cooled down. Thus, processing time is shortened, and high processing efficiency is provided. Therefore, the heat treatment apparatus can form the predetermined film having a low dielectric constant and provide high processing efficiency.

20 Claims, 8 Drawing Sheets

APPARATUS FOR AND METHOD OF HEAT TREATMENT AND SUBSTRATE PROCESSING APPARATUS

BACKGROUND OF THE INVENTION

1. Field of the Invention

The present invention relates to a heat treatment apparatus for and method of heat-treating a semiconductor substrate, a glass substrate for a liquid crystal display, a glass substrate for a photomask, a substrate for an optical disk and the like (referred to hereinafter as "substrates") which are coated with a processing solution of a low-dielectric-constant material and the like to form a predetermined film such as an interlayer insulation film on the substrates, and a substrate processing apparatus having the heat treatment apparatus incorporated therein.

2. Description of the Background Art

Conventionally, circuit patterns formed on the substrates have multi-layer interconnections, and it is important that an interlayer insulation film between the multilayer interconnections has a flatness and an insulating property (or a low dielectric constant). Such an interlayer insulation film is formed by coating a substrate with a low-dielectric-constant material such as SOD (Spin-on-Dielectronics) or polyimides and then firing the substrate by heat treatment.

An interlayer insulation film has been conventionally formed from a polyimide coating, for example, by a method to be described below. First, a spinning-type coating apparatus (a spin coater) or the like is used to uniformly coat a substrate with a processing solution of a polyimide. The substrate coated with the polyimide processing solution is transported into a chamber of a heat treatment apparatus for heat treatment. The substrate is then placed on a hot plate heated to a predetermined temperature within the chamber. After the transportation of the substrate into the chamber, a nitrogen gas is introduced into the chamber to provide a low oxygen concentration atmosphere within the chamber. When the substrate is heated to not less than the critical temperature for reaction (referred to hereinafter as a "critical reaction temperature") of the polyimide in the low oxygen concentration atmosphere, a chemical reaction occurs in the polyimide on the substrate to form an interlayer insulation film having a relatively low dielectric constant and a high degree of flatness.

However, the formation of the interlayer insulation film by the above-mentioned background art method presents problems to be described below.

To reduce the dielectric constant of the interlayer insulation film, it is necessary to heat the substrate coated with the processing solution of polyimides, SOD or the like in a low oxygen concentration atmosphere. In the background art method, the substrate is heated up to a predetermined temperature immediately after the substrate is transported into the chamber in which the ambient atmosphere is left. This increases the dielectric constant of the interlayer insulation film.

More specifically, as the substrate coated with the processing solution of polyimides, SOD or the like is transported into the chamber, outside air flows into the chamber to cause the oxygen concentration in the chamber to approach the oxygen concentration in the ambient atmosphere. For this reason, the nitrogen gas is introduced into the chamber to provide the low oxygen concentration atmosphere within the chamber. However, during the time between the instant immediately after the transportation of the substrate into the chamber and the instant at which the low oxygen concentration atmosphere is provided, the substrate is heated to not less than the critical reaction temperature at which a chemical reaction occurs in the processing solution coating the substrate. As a result, the chemical reaction occurs in an atmosphere of a relatively high oxygen concentration to cause oxygen molecules to be introduced into the interlayer insulation film, thereby forming the interlayer insulation film having a relatively high dielectric constant.

To prevent the above phenomenon, the heating of the substrate up to not less than the critical reaction temperature is required to await a predetermined oxygen concentration or lower reached within the chamber into which the nitrogen gas is introduced after the transportation of the substrate into the chamber. However, it takes much time for the oxygen concentration within the chamber to reach the predetermined oxygen concentration or lower. This presents another problem in low processing efficiency.

Additionally, if the substrate heated to an elevated temperature is transported out of the chamber immediately after the completion of the heating process, oxygen molecules are introduced into the interlayer insulation film, thereby increasing the dielectric constant of the interlayer insulation film formed by the firing process. It is therefore necessary to transport the substrate out of the chamber after the substrate is cooled down to a temperature lower than the critical reaction temperature in the low oxygen concentration atmosphere within the chamber. However, it also takes much time to cool down the high-temperature substrate within the chamber, and the problem of low processing efficiency as in the heating process is also encountered.

SUMMARY OF THE INVENTION

The present invention is intended for a heat treatment apparatus for performing heat treatment upon a substrate coated with a processing solution to form a predetermined film on the substrate.

According to the present invention, the heat treatment apparatus comprises: a processing chamber having a low oxygen concentration atmosphere maintained therein for performing the heat treatment upon a substrate; a heater in the processing chamber for placing thereon the substrate loaded into the processing chamber to heat the substrate; a loading/unloading unit movable into and out of the processing chamber for loading and unloading the substrate into and out of the processing chamber; and a cooling part in the loading/unloading unit for cooling the substrate held by the loading/unloading unit.

The heat treatment of the substrate is performed in the low oxygen concentration atmosphere to form the predetermined film having a low dielectric constant. Additionally, rapid heating and cooling provide high processing efficiency.

Preferably, according to one aspect of the present invention, the processing chamber comprises an opening through which the substrate is loaded into and unloaded out of the processing chamber by the loading/unloading unit, and the heat treatment apparatus further comprises: an opening/closing part for closing or opening the opening; and a nitrogen gas supply part for supplying nitrogen gas into the processing chamber, wherein the nitrogen gas supply part supplies the nitrogen gas into the processing chamber at least when the opening/closing part opens the opening.

This prevents outside air from entering the processing chamber through the opening to avoid the entry of oxygen into the processing chamber, thereby ensuring the above-mentioned effects.

Preferably, according to another aspect of the present invention, after receiving the substrate heated by the heater, the loading/unloading unit places the substrate in a standby condition within the processing chamber until the temperature of the substrate becomes lower than a predetermined temperature, and then exits from the processing chamber.

The substrate is held in the low oxygen concentration atmosphere until the temperature of the substrate becomes below the predetermined temperature. This ensures the above-mentioned effects.

The present invention is also intended for a substrate processing apparatus for coating a substrate with a processing solution and performing heat treatment upon the substrate to form a predetermined film on the substrate.

The present invention is also intended for a method of performing heat treatment upon a substrate coated with a processing solution to form a predetermined film on the substrate.

It is therefore an object of the present invention to provide an apparatus for and method of heat treatment which is capable of forming a predetermined film having a low dielectric constant and which is high in processing efficiency, and to provide a substrate processing apparatus having the heat treatment apparatus incorporated therein.

These and other objects, features, aspects and advantages of the present invention will become more apparent from the following detailed description of the present invention when taken in conjunction with the accompanying drawings.

DESCRIPTION OF THE PREFERRED EMBODIMENTS

A preferred embodiment of the present invention will now be described in detail with reference to the drawings.

<1. Overall Construction of Substrate Processing Apparatus>

Figure 1:
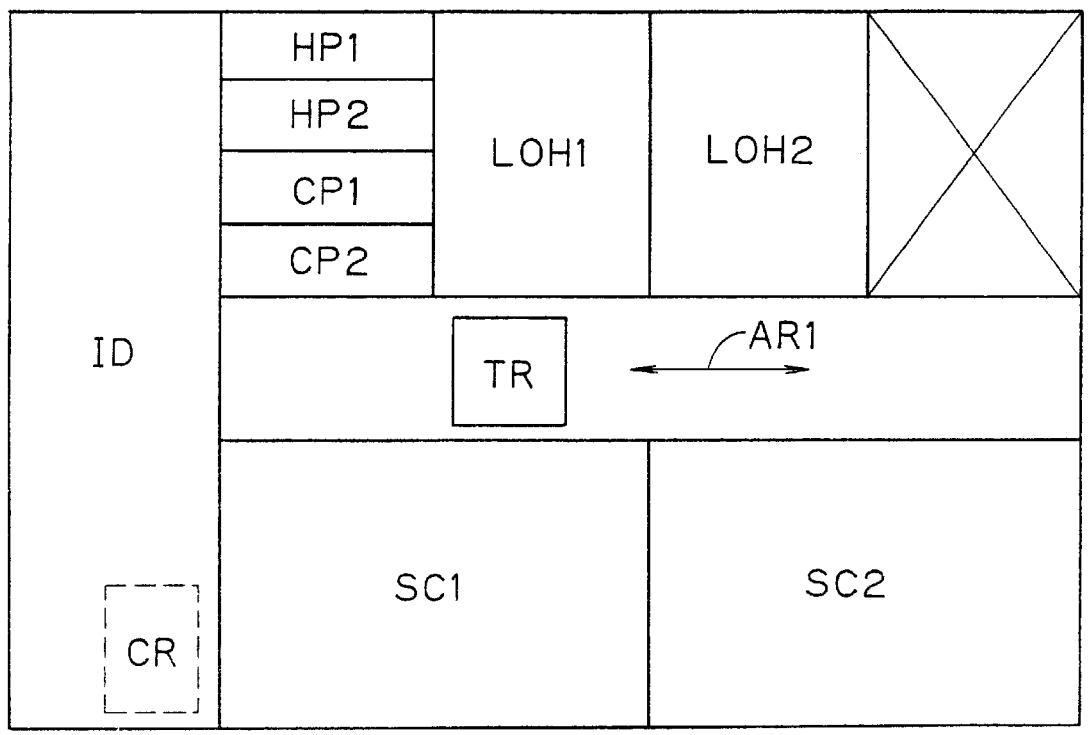
FIG. 1 is a plan view of an example of the overall construction of a substrate processing apparatus.

Description will be given on the overall construction of a substrate processing apparatus having a heat treatment apparatus incorporated therein according to the present invention. FIG. 1 is a plan view of an example of the overall construction of the substrate processing apparatus. The substrate processing apparatus of FIG. 1 comprises an indexer ID for transferring a substrate W to a transport robot TR; spinning-type coating apparatuses (spin coaters) SC1 and SC2 for coating the substrate W with a low-dielectric-constant material such as SOD and polyimides; heat treatment apparatuses LOH1 and LOH2 according to the present invention; hot plate units HP1 and HP2 for heating the substrate W; cool plate units CP1 and CP2 for cooling the substrate W; and the transport robot TR for transporting the substrate W among the above-mentioned components of the substrate processing apparatus.

The indexer ID is capable of placing thereon a plurality of cassettes each of which can accommodate a plurality of substrates W and includes a transfer mechanism (not shown) for transferring a substrate W between the cassettes and the transport robot TR. The indexer ID has the functions of transferring an unprocessed substrate W stored in the cassettes to the transport robot TR and receiving a processed substrate W from the transport robot TR to store the processed substrate W in the cassettes.

The spin coaters SC1 and SC2 discharge a processing solution of a low-dielectric-constant material such as SOD and polyimides onto a substrate W while spinning the substrate W held in a substantially horizontal position to coat the substrate W with the low-dielectric-constant material.

The heat treatment apparatuses LOH1 and LOH2 have the function of performing heat treatment in a low oxygen concentration atmosphere upon the substrate W coated with the processing solution of the low-dielectric-constant material such as SOD and polyimides, thereby to form an interlayer insulation film on the substrate W. The heat treatment apparatuses LOH1 and LOH2 will be described in detail later.

The hot plate units HP1 and HP2 include a heating mechanism and have the function of heating a substrate W transported therein up to a predetermined temperature. The cool plate units CP1 and CP2 include a cooling mechanism and have the functions of cooling a substrate W transported therein down to a predetermined temperature and maintaining the substrate W at the predetermined temperature. The hot plate units HP1, HP2 and the cool plate units CP1, CP2 are vertically stacked in the order named from top to bottom, but are shown in FIG. 1 as arranged in a horizontal plane for purposes of illustration.

The transport robot TR is horizontally movable as indicated by the arrow AR1 of FIG. 1 along a transport road disposed between a processing unit array including the spin coaters SC1 and SC2 and a processing unit array including the heat treatment apparatuses LOH1, OLH2, the hot plate units HP1, HP2 and the cool plate units CP1, CP2. The transport robot TR is rotatable and vertically movable by a drive mechanism not shown. This allows the transport robot TR to transport a substrate W among the indexer ID and the above-mentioned processing units SC1, SC2, LOH1, LOH2, HP1, HP2, CP1, CP2.

The substrate processing apparatus contains a controller CR constructed by the use of a computer. The controller CR is electrically connected to the above-mentioned processing units and controls the operations of the processing units and the substrate transportation of the transport robot TR in accordance with a predetermined processing program.

In this preferred embodiment, the spin coaters SC1 and SC2 correspond to a coating unit.

<2. Overall Procedure in Substrate Processing Apparatus>

Figure 2:
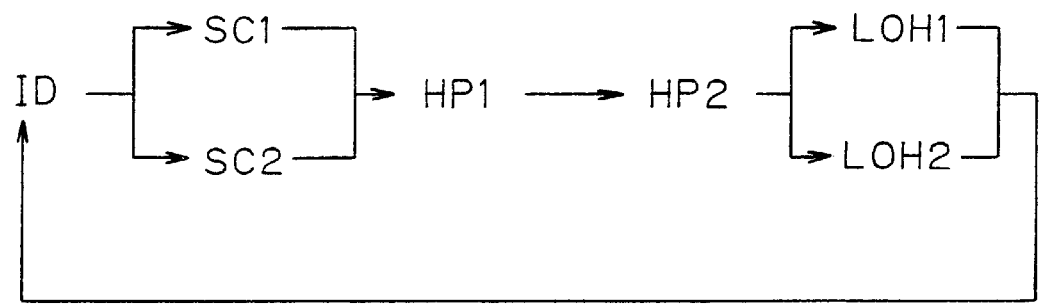
FIG. 2 shows an example of process steps in the substrate processing apparatus of FIG. 1.

Brief description will be given on the overall procedure in the substrate processing apparatus having the above construction. FIG. 2 shows an example of process steps in the substrate processing apparatus of FIG. 1. The processing units to which a substrate W is transported are shown in FIG. 2 in the order of the transportation. Every transportation of a substrate W among the processing units is effected by the transport robot TR in accordance with an instruction from the controller CR. The processing in the processing units is carried out also in accordance with an instruction from the controller CR.

When a cassette having unprocessed substrates stored therein is placed on the indexer ID, an unprocessed substrate W is transferred from the cassette to the transport robot TR. The transport robot TR transports the received unprocessed substrate W into either of the spin coaters SC1 and SC2. The spin coater SC1 or SC2 which receives the unprocessed substrate W coats the substrate W with a processing solution of SOD while spinning the substrate W. The processing solution for coating is not limited to SOD but may be of other low-dielectric-constant materials such as polyimides. Whether to transport the substrate W into the spin coater SC1 or the spin coater SC2 may be determined by the vacancy thereof at that point of time (which is so-called parallel processing). This is because the coating process requires longer time than other processes.

After the coating process is completed, the transport robot TR transports the substrate W from the spin coater SC1 or SC2 into the hot plate unit HP1. The hot plate unit HP1 heats the substrate W coated with the processing solution of SOD up to a predetermined temperature. This heat treatment is a pre-heating process for the process of forming an interlayer insulation film by firing in the heat treatment apparatuses LOH1 and LOH2. Heating temperature in the hot plate unit HP1 (lower than the critical reaction temperature of the low-dielectric-constant material) is much lower than the heat treatment temperature in the heat treatment apparatuses LOH1 and LOH2.

Thereafter, the transport robot TR transports the substrate W from the hot plate unit HP1 into the hot plate unit HP2. The hot plate unit HP2 also heats the substrate W up to a predetermined temperature. This heat treatment is also a pre-heating process for the process of forming the interlayer insulation film by firing in the heat treatment apparatuses LOH1 and LOH2. Heating temperature in the hot plate unit HP2 is intermediate between the heat treatment temperature in the heat treatment apparatuses LOH1 and LOH2 and the heat treatment temperature in the hot plate unit HP1, but is lower than the critical reaction temperature of the low-dielectric-constant material.

After the heating process in the hot plate unit HP2 is completed, the transport robot TR transports the substrate W from the hot plate unit HP2 into either of the heat treatment apparatuses LOH1 and LOH2. The heat treatment apparatuses LOH1 and LOH2 perform the process of firing the substrate W in a low oxygen concentration atmosphere to form an interlayer insulation film on the substrate W. The heat treatment in the heat treatment apparatuses LOH1 and LOH2, which is to be described in detail later, includes heating the substrate W at a temperature not less than the critical reaction temperature of the low-dielectric-constant material to form the interlayer insulation film by firing. As illustrated in FIG. 2, the heat treatment in the heat treatment apparatus LOH1 or LOH2 is parallel processing, and the substrate W may be transported into either of the heat treatment apparatuses LOH1 and LOH2.

After the firing process of the interlayer insulation film on the substrate W in the heat treatment apparatus LOH1 or LOH2 is completed, the transport robot TR transports the substrate W from the heat treatment apparatus LOH1 or LOH2, and returns the processed substrate W to the indexer ID. The indexer ID stores the processed substrate W into a cassette. Then, the cassette in which a predetermined number of processed substrates are stored is carried out of the substrate processing apparatus. The substrate W subjected to the heat treatment in the heat treatment apparatus LOH1 or LOH2 may be transported once into the cool plate unit CP1 or CP2 before being returned to the indexer ID.

Thus, a sequence of processes for the formation of the interlayer insulation film on the substrate W is completed.

<3. Construction of Heat Treatment Apparatuses LOH1 and LOH2>

Figure 3:
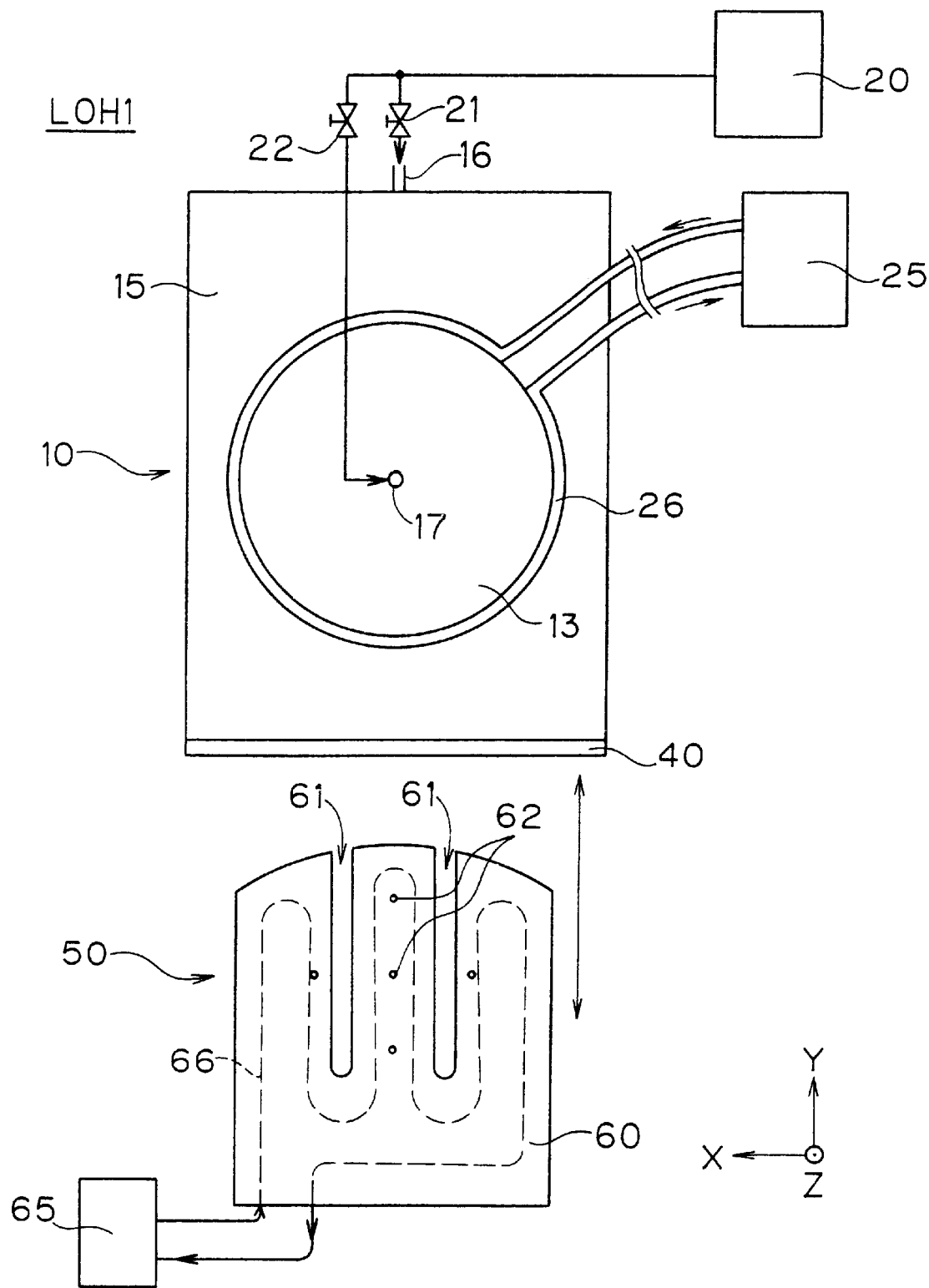
FIG. 3 is a plan view of a heat treatment apparatus incorporated in the substrate processing apparatus of FIG. 1.
Figure 4:
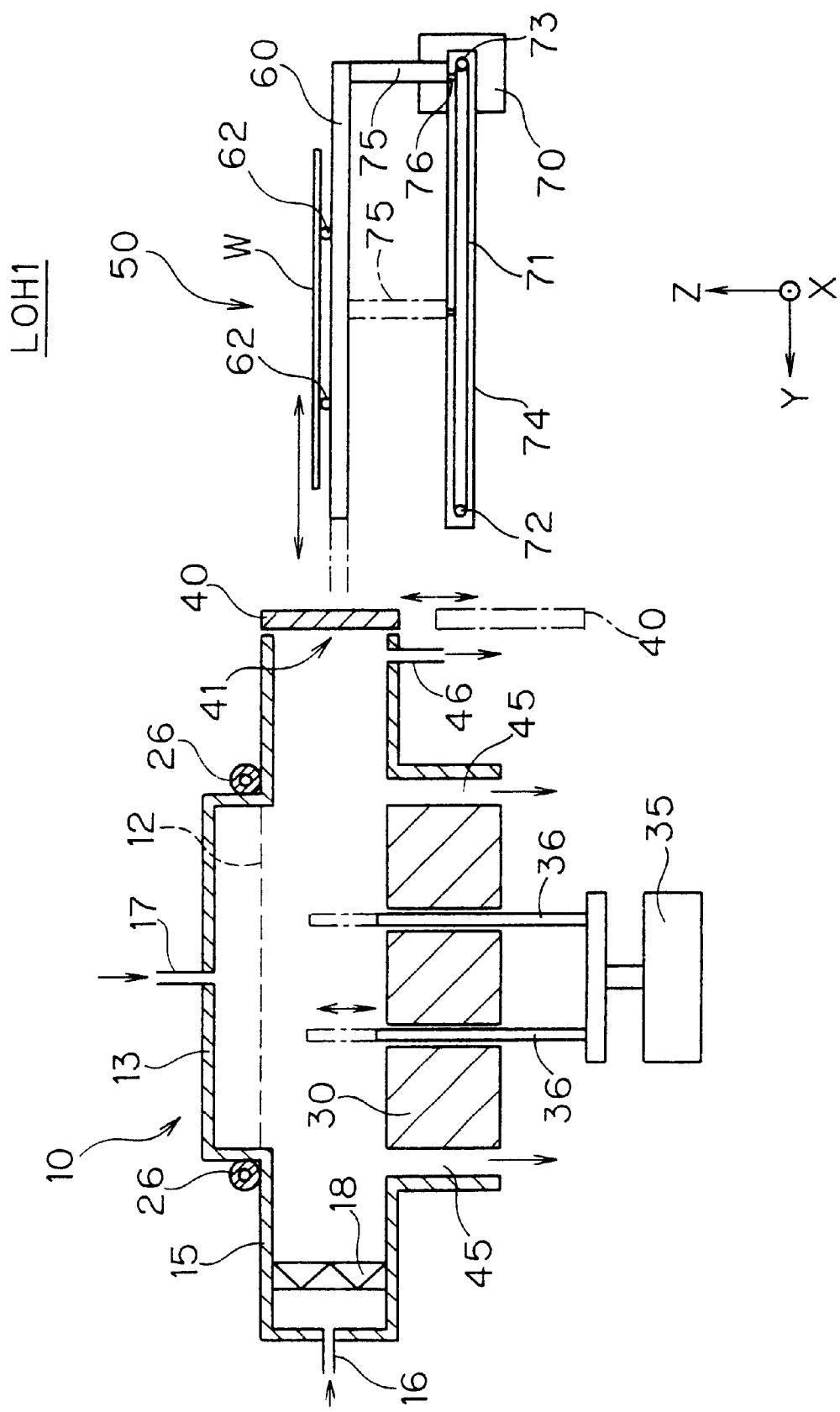
FIG. 4 is a side sectional view of the heat treatment apparatus incorporated in the substrate processing apparatus of FIG. 1.
Figure 5:
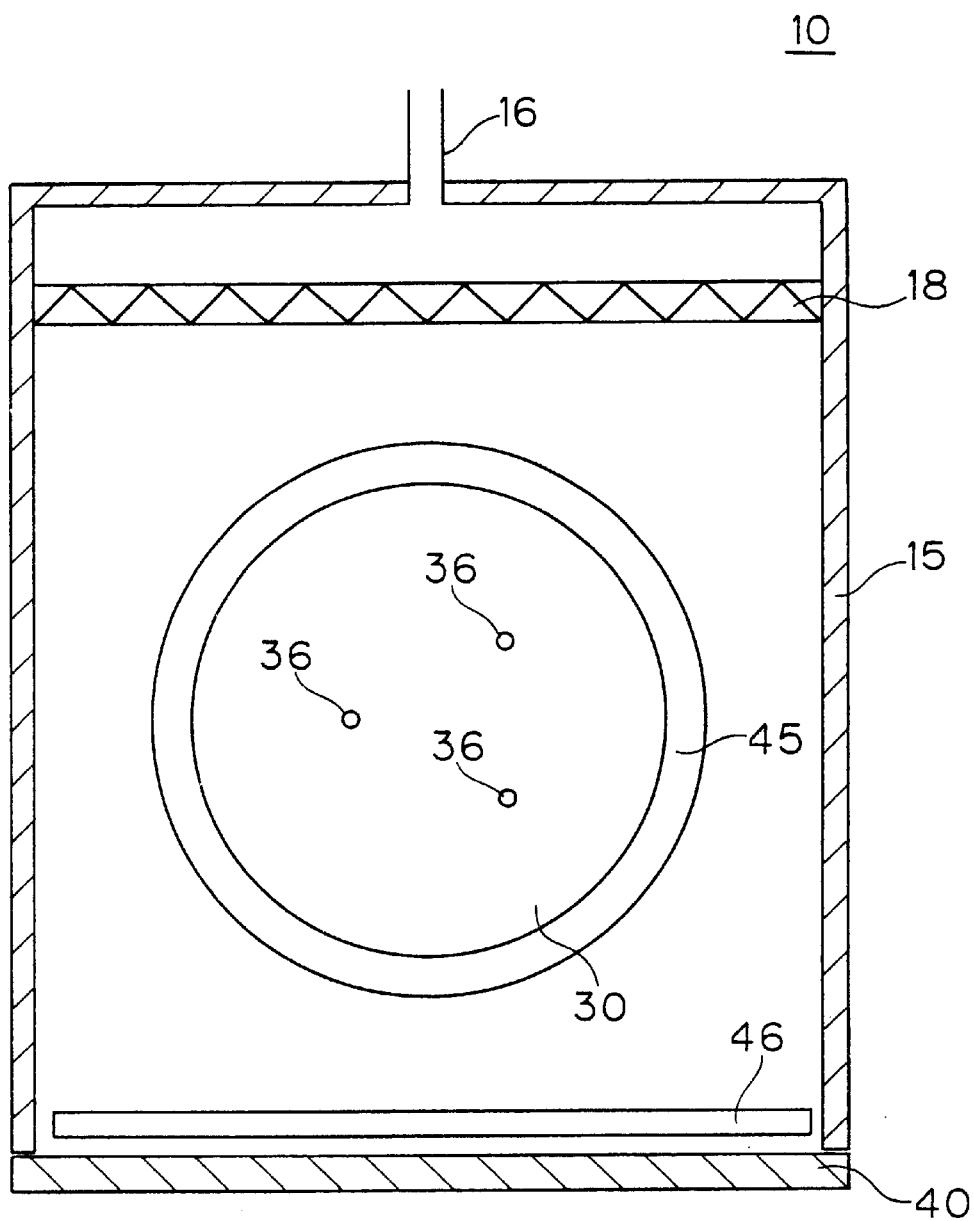
FIG. 5 is a top plan sectional view of a heating unit in the heat treatment apparatus incorporated in the substrate processing apparatus of FIG. 1.

The construction of the heat treatment apparatuses LOH1 and LOH2 incorporated in the substrate processing apparatus will be described. Although description will be given hereinafter on only the heat treatment apparatus LOH1, the heat treatment apparatus LOH2 is completely identical in construction with the heat treatment apparatus LOH1. FIG. 3 is a plan view of the heat treatment apparatus LOH1. FIG. 4 is a side sectional view of the heat treatment apparatus LOH1. FIG. 5 is a top plan sectional view of a heating unit 10 in the heat treatment apparatus LOH1. An XYZ rectangular coordinate system in which the horizontal plane is defined as an XY plane and the vertical direction as a Z direction is additionally shown in FIGS. 3 through 5 for purposes of clarifying the directional relationship therebetween.

The heat treatment apparatus LOH1 principally comprises the heating unit 10 and a load/unload unit 50. The heating unit 10 has the function of performing a heating process in a low oxygen concentration atmosphere. The load/unload unit 50 has the functions of transporting a substrate W into and out of the heating unit 10 and cooling the substrate W.

The heating unit 10 comprises a chamber 15 having a heater 30 disposed therein. The chamber 15 is an enclosure of a substantially rectangular parallelepiped configuration, and has a ceiling portion 13 of a cylindrical configuration. The chamber 15 serves as a processing chamber for performing heat treatment for the formation of the interlayer insulation film on the substrate W loaded therein. A low oxygen concentration atmosphere maintaining mechanism to be described later always maintains the low oxygen concentration atmosphere within the chamber 15.

The heater 30 is a disc-shaped member having therein a heat source by means of resistance heating and the like, and maintains a predetermined temperature previously set. Three support pins 36 are provided extending through the heater 30 in the vertical direction (Z direction). The three support pins 36 are capable of abutting against the bottom surface of a substrate W to support the substrate W, and is vertically movable by an elevating unit 35. The elevating unit 35 may comprise, for example, an air cylinder. With the substrate W supported by the three support pins 36, the elevating unit 35 vertically moves the support pins 36 to vertically move the substrate W supported by the support pins 36 between a heating position directly above the heater 30 and a substrate transfer position over the heating position. When the substrate W is supported at the heating position by the support pins 36, the substrate W is heated to a predetermined temperature by the heater 30. In other words, the heater 30 serves as a heating means for placing thereon the substrate W transported in the chamber 15 to heat the substrate W.

The chamber 15 has an opening 41 for loading/unloading the substrate W into/out of the chamber 15 therethrough. The opening 41 is positioned laterally outwardly of a first end of the substrate W placed on the heater 30, i.e., the substrate W supported at the heating position by the support pins 36. The chamber 15 further includes a gate valve 40 vertically movable by a drive mechanism not shown. The opening 41 is closed by the upward movement of the gate valve 40 and is opened by the downward movement of the gate valve 40. When the opening 41 is open with the gate valve 40 lowered, the load/unload unit 50 loads/unloads the substrate W into/out of the chamber 15 through the opening 41. When the opening 41 is closed with the gate valve 40 raised, a closed space is defined within the chamber 15.

The above-mentioned low oxygen concentration atmosphere maintaining mechanism principally comprises a gas inlet 16 and an exhaust outlet 46. The low oxygen concentration atmosphere maintaining mechanism serves to maintain the low oxygen concentration atmosphere within the chamber 15 when the opening 41 is open with the gate valve 40 lowered.

The gas inlet 16 is positioned laterally outwardly of a second end of the substrate W on the opposite side of the substrate W from the opening 41, with the substrate W placed on the heater 30. The gas inlet 16 is connected through a valve 21 to a nitrogen gas supply unit 20. With the valve 21 in an open position, nitrogen gas supplied from the nitrogen gas supply unit 20 flows laterally into the chamber 15 through the gas inlet 16 on the side of the second end of the substrate W. A diffusion filter 18 is provided within the chamber 15 in proximity to the gas inlet 16. The nitrogen gas fed into the chamber 15 through the gas inlet 16 is diffused by the diffusion filter 18 to produce a uniform laminar flow in the horizontal direction (Y direction) within the chamber 15, i.e., in parallel to a main surface of the substrate W placed on the heater 30.

When the opening 41 is open, the produced laminar flow exits from the chamber 15 through the opening 41. The uniform laminar flow of nitrogen gas produced in parallel to the main surface of the substrate W within the chamber 15 and exiting from the chamber 15 through the opening 41 prevents outside air from entering the chamber 15 through the opening 41 to avoid a flow of oxygen into the chamber 15, consequently maintaining the low oxygen concentration atmosphere within the chamber 15.

The exhaust outlet 46 is provided in linear form immediately before the gate valve 40 within the chamber 15, i.e., under the opening 41. The exhaust outlet 46 is connected to an exhaust line provided outside the figures through a valve not shown. The valve may be opened to exhaust gases from the chamber 15 through the exhaust outlet 46. When the opening 41 is closed with the gate valve 40 raised, the laminar flow produced within the chamber 15 exits from the chamber 15 through the exhaust outlet 46. When the opening 41 is open with the gate valve 40 lowered, a slight amount of outside air flowing through the opening 41 is exhausted through the exhaust outlet 46. This prevents outside air from entering the chamber 15 to maintain the low oxygen concentration atmosphere within the chamber 15.

The chamber 15 further includes a gas inlet 17 and an exhaust outlet 45. The gas inlet 17 is provided in a central part of the ceiling portion 13 of the chamber 15. The gas inlet 17 is connected through a valve 22 to the above-mentioned nitrogen gas supply unit 20. With the valve 22 in an open position, nitrogen gas supplied from the nitrogen gas supply unit 20 flows downwardly into the chamber 15 through the gas inlet 17.

The exhaust outlet 45 is provided in annular form around the heater 30 within the chamber 15. The exhaust outlet 45 is connected to an exhaust line provided outside the figures through a valve not shown. The valve may be opened to exhaust gases from the chamber 15 through the exhaust outlet 45.

The gas inlet 17 and the exhaust outlet 45 differ from the gas inlet 16 and the exhaust outlet 46 in operating principally during the heating of the substrate W in the chamber 15. Specifically, during the heating of the substrate W, the nitrogen gas supplied into the chamber 15 through the gas inlet 17 is exhausted through the exhaust outlet 45. This removes impurities sublimed from the substrate W by heating, and also prevents convection of gases from occurring within the chamber 15.

The chamber 15 further includes a top 12 inside the ceiling portion 13. The top 12 is a disc-shaped member having a multiplicity of ventilating openings for passage of the nitrogen gas flowing into the chamber 15 through the gas inlet 17. An annular cooling pipe 26 surrounds an outer wall of the ceiling portion 13. The cooling pipe 26 is connected to a coolant supply unit 25. A coolant supplied from the coolant supply unit 25 is adapted to be fed through the inside of the cooling pipe 26 back to the coolant supply unit 25. The coolant supplied from the coolant supply unit 25 to the cooling pipe 26 cools down the ceiling portion 13 and the top 12 provided inside the ceiling portion 13 through the cooling pipe 26. The substrate W is cooled down by positioning the substrate W in proximity to the cooled top 12.

The load/unload unit 50 principally comprises a transport arm 60 and a motor 70 for driving the transport arm 60. The transport arm 60 includes a plurality of protrusions 62 and two indentations 61. The plurality of protrusions 62 abut against the bottom surface of the substrate W to support the substrate W, whereby the transport arm 60 can hold the substrate W thereon. The two indentations 61 are adapted to receive the support pins 36 of the heating unit 10. This prevents the movement of the transport arm 60 into and out of the chamber 15 and the vertical movement of the support pins 36 from interfering with each other. The transport arm 60 can move into the chamber 15 with the support pins 36 in its raised position, and the support pins 36 can move upwardly with the transport arm 60 moved in the chamber 15.

As illustrated in FIG. 3, cooling piping 66 is disposed inside the transport arm 60. The cooling piping 66 is connected to a coolant supply unit 65. A coolant supplied from the coolant supply unit 65 is fed through the inside of the cooling piping 66 back to the coolant supply unit 65. In other words, the coolant supply unit 65 circulates the coolant through the cooling piping 66. The coolant passing through the cooling piping 66 substantially uniformly cools down at least a region of the transport arm 60 which is opposed to the substrate W held by the transport arm 60. This cools down the substrate W held by the transport arm 60.

The transport arm 60 is movable in the Y direction by a drive mechanism including the motor 70, a driving pulley 73, a driven pulley 72 and a belt 71. The driving pulley 73 is fixed to the motor shaft of the motor 70. The driven pulley 72 is free to rotate. The belt 71 is wound around the driving pulley 73 and the driven pulley 72. Thus, as the motor 70 is driven in the normal or reverse direction, the driving pulley 73 accordingly rotates to cause the belt 71 to run around the driving pulley 73 and the driven pulley 72.

An arm support 75 extends vertically from beneath the transport arm 60. The arm support 75 is free to slide relative to a guide member 74. The arm support 75 and the belt 71 are coupled to each other through a coupling member 76. Thus, as the motor 70 is driven to cause the belt 71 to run around, the arm support 75 slides in the Y direction to accordingly move the transport arm 60 into and out of the chamber 15. Because of such movement of the transport arm 60 into and out of the chamber 15, the transport arm 60 can transport the substrate W into and out of the chamber 15.

Although the construction of the heat treatment apparatus LOH1 is described above, the mechanism for driving the transport arm 60 in the Y direction is not limited to the above-mentioned belt-driven mechanism, but may be a mechanism capable of driving the transport arm 60 linearly in the Y direction, for example, a feed screw mechanism having a combination of a ball screw and an internally threaded screw. The means for cooling the substrate W held by the transport arm 60 is not limited to the coolant supply but may be other cooling mechanisms, for example, a Peltier element.

In this preferred embodiment, the chamber 15 corresponds to a processing chamber; the transport arm 60 corresponds to a loading/unloading unit; the cooling piping 66 corresponds to a cooling part; the gate valve 40 corresponds to an opening/closing part; the gas inlet 16 corresponds to a nitrogen gas supply part; and the top 12 corresponds to a processing chamber cooling part.

<4. Procedure in Heat Treatment Apparatuses LOH1 and LOH2>

Next, a procedure in the heat treatment apparatuses LOH1 and LOH2 will be described with reference to FIGS. 6 through 10. FIGS. 6 through 10 show respective steps of the procedure in the heat treatment apparatus LOH1. Although description will be given hereinafter on only the heat treatment apparatus LOH1, the heat treatment apparatuses LOH1 and LOH2 perform parallel processing and the heat treatment apparatus LOH2 is completely identical in procedure with the heat treatment apparatus LOH1. Every processing in the heat treatment apparatus LOH1 is performed in accordance with an instruction from the controller CR.

Figure 6:
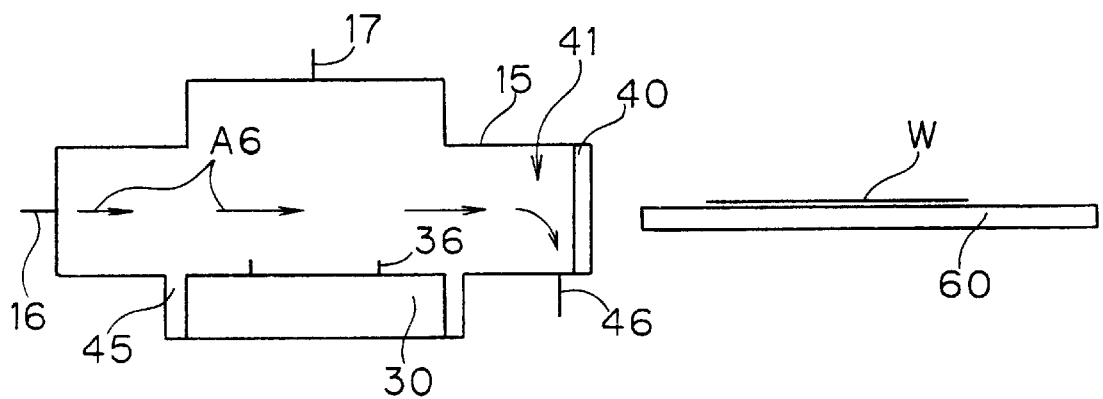
FIGS. 6 through 10 show respective steps of a procedure in the heat treatment apparatus.

As stated above, a substrate W pre-heated in the hot plate unit HP2 is transported by the transport robot TR into the heat treatment apparatus LOH1. More specifically, the transport robot TR transfers the pre-heated substrate W to the transport arm 60. FIG. 6 shows the heat treatment apparatus LOH1 with the substrate W transferred to the transport arm 60. When the substrate W is transferred to the transport arm 60, the valve 21 of the gas inlet 16 and the valve of the exhaust outlet 46 are opened. Nitrogen gas flows through the gas inlet 16 into the chamber 15. The nitrogen gas is diffused by the diffusion filter 18 to produce a uniform laminar flow in the horizontal direction (Y direction) within the chamber 15, as indicated by the arrows A6 of FIG. 6. At this time, the gate valve 40 is in its raised position to close the opening 41, and the laminar flow of nitrogen gas produced within the chamber 15 exits from the chamber 15 through the exhaust outlet 46. In this step, the supply of nitrogen gas through the gas inlet 17 and the exhaust through the exhaust outlet 45 are not carried out.

Figure 7:
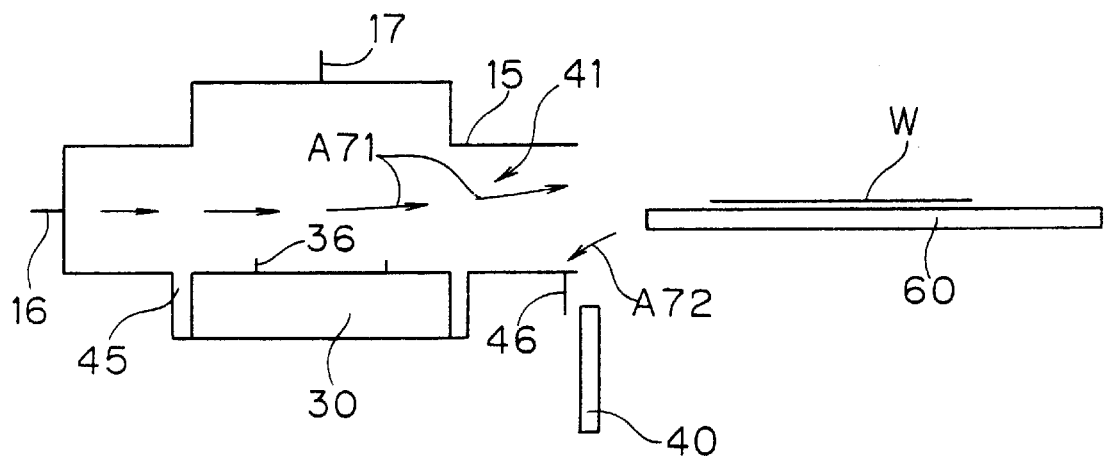

Next, the gate valve 40 is lowered to open the opening 41. FIG. 7 shows the heat treatment apparatus LOH1 with the opening 41 open. The opening 41 in its open position permits the laminar flow of nitrogen gas produced within the chamber 15 to exit from the chamber 15 through the opening 41, as indicated by the arrows A71 of FIG. 7. As mentioned above, the uniform laminar flow of nitrogen gas exiting from the chamber 15 through the opening 41 prevents outside air from entering the chamber 15 through the opening 41 to avoid a flow of oxygen into the chamber 15, consequently maintaining the low oxygen concentration atmosphere within the chamber 15.

The laminar flow of nitrogen gas produced within the chamber 15 exits from the chamber 15 through the opening 41 while moving slightly upwardly as indicated by the arrows A71 of FIG. 7 since it is warmed up by the heater 30. As a result, in a lower part of the opening 41, outside air is dragged into the opening 41, and a small amount of ambient atmosphere flows into the chamber 15 through the opening 41. However, the outside air dragged into the opening 41 is exhausted through the exhaust outlet 46 under the opening 41 as indicated by the arrow A72 of FIG. 7. This prevents the ambient atmosphere from entering the chamber 15 to maintain the low oxygen concentration atmosphere within the chamber 15. Thus, the exhaust outlet 46 has the two functions of exhausting the laminar flow of nitrogen gas when the opening 41 is closed and preventing outside air from entering the chamber 15 when the opening 41 is open.

Figure 8:
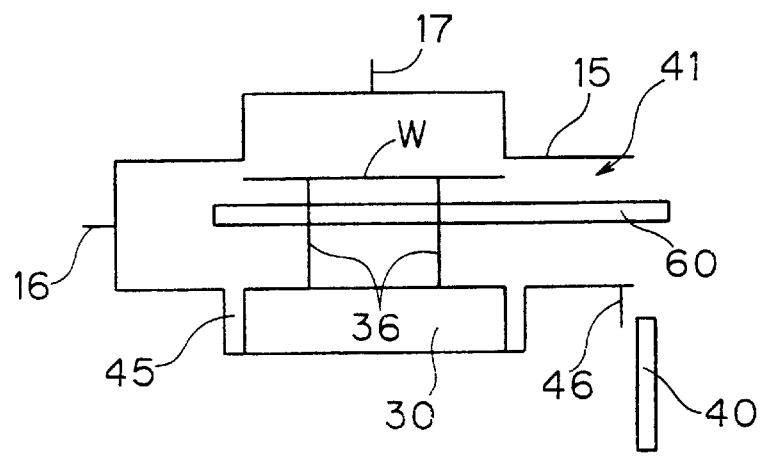

Next, the transport arm 60 which hold the substrate W moves forward into the chamber 15. The transport arm 60 stops at a predetermined position (at which the substrate W is directly above the heater 30) within the chamber 15. Then, the support pins 36 move upwardly to abut against the bottom surface of the substrate W, and lift the substrate W to separate the substrate W from the transport arm 60. In other words, the substrate W is transferred from the transport arm 60 to the support pins 36. FIG. 8 shows the heat treatment apparatus LOH1 with the substrate W transferred from the transport arm 60 to the support pins 36.

In this step, the laminar flow is produced within the chamber 15 by supplying the nitrogen gas through the gas inlet 16 and exits from the chamber 15 through the opening 41, and outside air dragged into the opening 41 is exhausted through the exhaust outlet 46, in the above-mentioned manner. Therefore, the low oxygen concentration atmosphere is maintained within the chamber 15.

Figure 9:
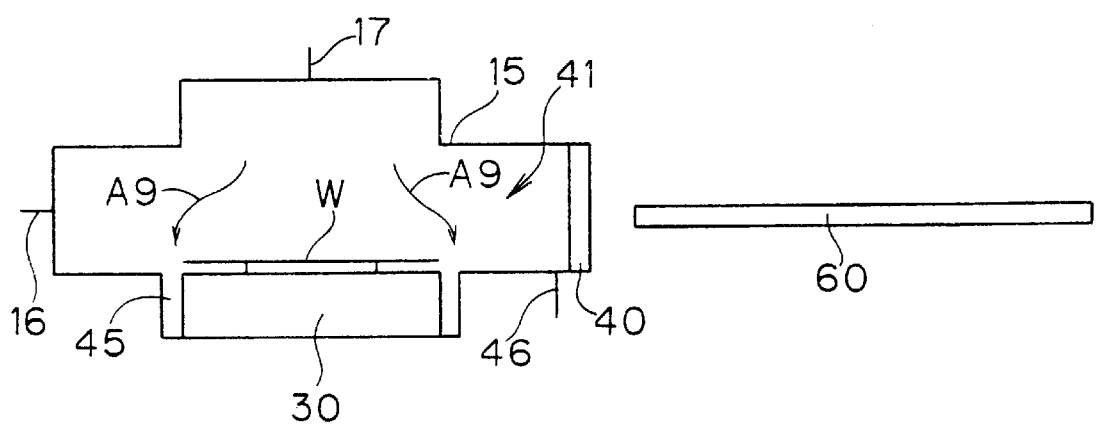

Next, the transport arm 60 from which the substrate W is transferred to the support pins 36 moves backward to exits from the chamber 15. Then, the gate valve 40 is raised to close the opening 41. Thereafter, the support pins 36 supporting the substrate W move downwardly to the heating position directly above the heater 30. Since the temperature of the heater 30 has already been raised to a predetermined temperature, the heating of the substrate W starts as soon as the substrate W is moved downwardly to the heating position directly above the heater 30. FIG. 9 shows the heat treatment apparatus LOH1 during the heating of the substrate W.

In this step, the supply of the nitrogen gas through the gas inlet 16 and the exhaust through the exhaust outlet 46 are stopped, and the valve 22 of the gas inlet 17 and the valve of the exhaust outlet 45 are opened. As indicated by the arrows A9 of FIG. 9, the nitrogen gas supplied through the gas inlet 17 passes through the top 12 to produce a downflow, and is then exhausted through the exhaust outlet 45. This removes impurities sublimed from the substrate W by heating, and also suppresses the convection of gases occurring within the chamber 15 to prevent impurities from being deposited on the substrate W. During the heating of the substrate W, no outside air enters the chamber 15 through the opening 41 since the gate valve 40 is in its raised position to close the opening 41. Therefore, the low oxygen concentration atmosphere is maintained within the chamber 15.

Figure 11:
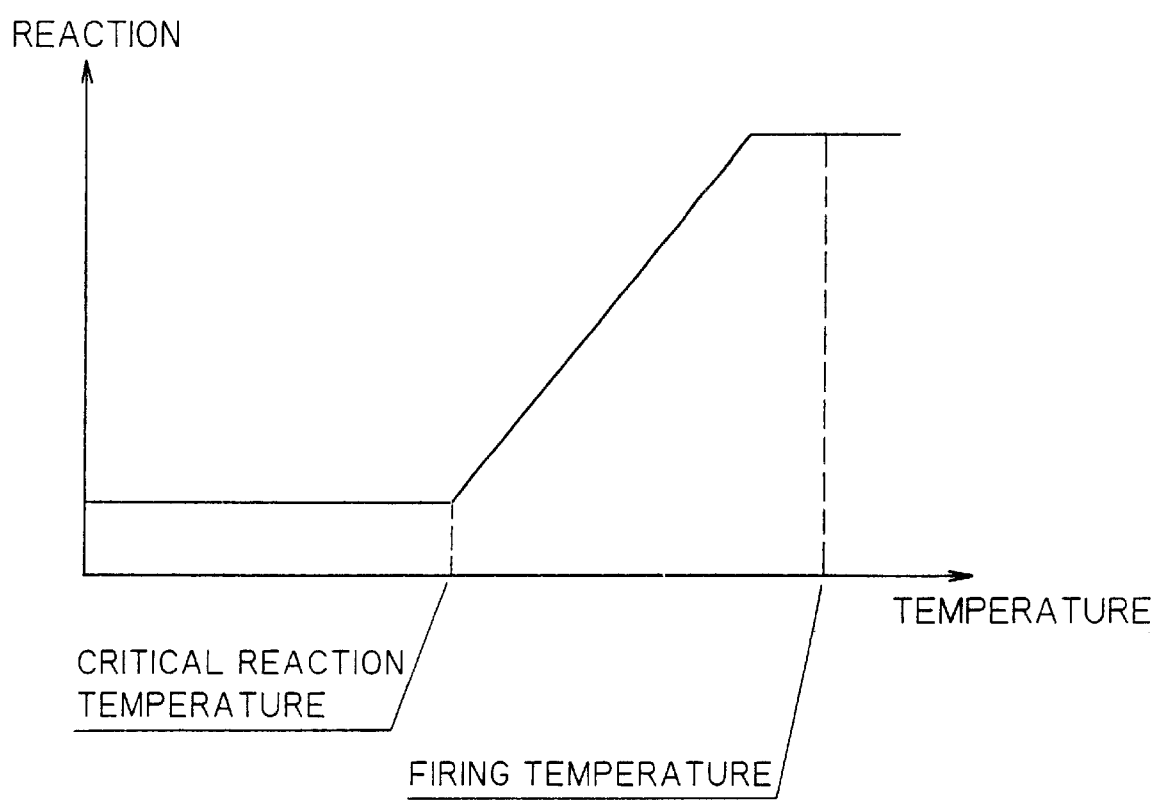
FIG. 11 shows a correlation between the heating temperature of a low-dielectric-constant material and the degree of reaction thereof.

FIG. 11 shows a correlation between the heating temperature of the low-dielectric-constant material and the degree of reaction thereof. The heating temperatures in the respective hot plate units HP1 and HP2 are lower than the critical reaction temperature of the low-dielectric-constant material. In such a temperature range, oxygen molecules are not introduced into the low-dielectric-constant material. On the other hand, the heating temperature of the substrate W in the heat treatment apparatus LOH1 is a firing temperature not less than the critical reaction temperature. At this firing temperature, the reaction of the low-dielectric-constant material proceeds sufficiently to consequently form the interlayer insulation film by firing. As above discussed, heating the substrate W up to the firing temperature not less than the critical reaction temperature might cause oxygen molecules to be introduced into the interlayer insulation film. However, the technique of this preferred embodiment can always maintain the low oxygen concentration atmosphere within the chamber 15 to prevent oxygen molecules from being introduced into the interlayer insulation film. This provides a low dielectric constant of the interlayer insulation film to be formed.

Additionally, the low oxygen concentration atmosphere is maintained within the chamber 15 also immediately after the substrate W is loaded into the chamber 15 (at the time the substrate W is transferred from the transport arm 60 to the support pins 36). Hence, the substrate W may be immediately moved downwardly to the heating position directly above the heater 30 to start being heated. This requires a short length of time to perform the firing process to increase the processing efficiency.

When the firing process of the substrate W is completed after an elapse of predetermined time, the support pins 36 move upwardly from the heating position directly above the heater 30 to the substrate transfer position. Then, the supply of the nitrogen gas through the gas inlet 17 and the exhaust through the exhaust outlet 45 are stopped, and valve 21 of the gas inlet 16 and the valve of the exhaust outlet 46 are opened. Thus, in the above-mentioned manner, the nitrogen gas flowing into the chamber 15 through the gas inlet 16 produces a uniform laminar flow within the chamber 15, and the laminar flow exits from the chamber 15 through the exhaust outlet 46.

Thereafter, the gate valve 40 is lowered to open the opening 41. In this step similar to the step shown in FIG. 7, the laminar flow is produced within the chamber 15 by supplying the nitrogen gas into the chamber 15 through the gas inlet 16 and exits from the chamber 15 through the opening 41, and the outside air dragged into the opening 41 is exhausted through the exhaust outlet 46. Therefore, the low oxygen concentration atmosphere is maintained within the chamber 15. Then, the transport arm 60 moves forward into the chamber 15, and stops at a predetermined position within the chamber 15. In this step, the coolant is circulated through the cooling piping 66.

Figure 10:
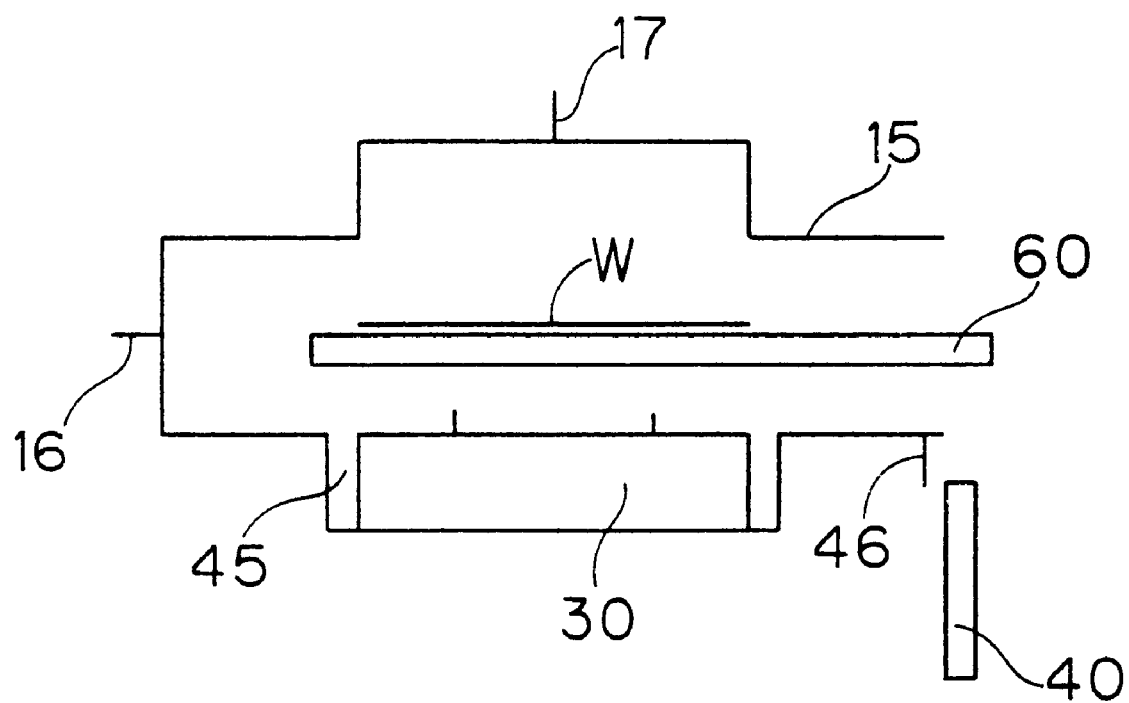

Next, the support pins 36 supporting the substrate W move downwardly, and the substrate W is transferred from the support pins 36 to the transport arm 60. FIG. 10 shows the heat treatment apparatus LOH1 with the substrate W transferred from the support pins 36 to the transport arm 60.

The substrate W held by the transport arm 60 is cooled down within the chamber 15 since the coolant is circulated through the cooling piping 66. Also in this step, the laminar flow is produced within the chamber 15 by supplying the nitrogen gas into the chamber 15 through the gas inlet 16 and exits from the chamber 15 through the opening 41, and the outside air dragged into the opening 41 is exhausted through the exhaust outlet 46. Therefore, the low oxygen concentration atmosphere is maintained within the chamber 15. Since the substrate W after the firing process is cooled down in the low oxygen concentration atmosphere, oxygen molecules are prevented from being introduced into the interlayer insulation film. This provides a low dielectric constant of the interlayer insulation film to be formed.

Additionally, the substrate W held on the transport arm 60 in which the coolant is circulated is quickly cooled down.

Next, after an elapse of predetermined time during which the substrate W is cooled down to lower than the critical reaction temperature, the transport arm 60 holding the substrate W thereon moves backward out of the chamber 15. That is, after receiving the heated substrate W, the transport arm 60 places the substrate W in a standby condition within the chamber 15 until the temperature of the substrate W becomes lower than the critical reaction temperature, and then exits from the chamber 15. If the substrate W cooled down to lower than the critical reaction temperature is exposed to the ambient atmosphere, oxygen molecules are not introduced into the interlayer insulation film. Then, the transport robot TR receives the substrate W subjected to the heat treatment from the transport arm 60. This completes a sequence of processes in the heat treatment apparatus LOH1.

In the heat treatment apparatus LOH1 of this preferred embodiment, as described above, the laminar flow is produced within the chamber 15 by supplying the nitrogen gas into the chamber 15 through the gas inlet 16 and exits from the chamber 15 through the opening 41 at least while the gate valve 40 opens the opening 41. Thus, the low oxygen concentration atmosphere is always maintained within the chamber 15 independently of whether the opening 41 is open or closed. The substrate W is held within the chamber 15 whenever the temperature of the substrate W is not lower than the critical reaction temperature. This prevents oxygen molecules from being introduced into the interlayer insulation film, to consequently provide a low dielectric constant of the interlayer insulation film to be formed.

The low oxygen concentration within the chamber 15 in this preferred embodiment refers to an oxygen concentration at which oxygen molecules are not introduced into the interlayer insulation film even when the temperature of the substrate W is not lower than the critical reaction temperature, and specifically is not higher than 100 ppm, more preferably not higher than 10 ppm.

Further, the substrate W loaded into the chamber 1S is immediately heated, and the substrate W held on the transport arm 60 in which the coolant is circulated is rapidly cooled. This shortens the time required for the processing in the heat treatment apparatus LOH1, to provide high processing efficiency.

Furthermore, only the supply of the nitrogen gas through the gas inlet 16 into the chamber 15 is required to maintain the low oxygen concentration atmosphere within the chamber 15. Therefore, the consumption of the nitrogen gas is suppressed.

<5. Modifications>

Although the preferred embodiment of the present invention is described hereinabove, the present invention is not limited to the above-mentioned example. For example, in the preferred embodiment, the substrate W is cooled by holding the substrate W on the transport arm 60 having the cooling piping 66 through which the coolant is circulated. Instead, the cooled top 12 may be used to cool the substrate W held on the transport arm 60 moving into the chamber 15 without the circulation of the coolant in the transport arm 60. This can also cool the substrate W within the chamber 15 in which the low oxygen concentration atmosphere is maintained, to prevent oxygen molecules from being introduced into the interlayer insulation film in a manner similar to the preferred embodiment, consequently providing a low dielectric constant of the interlayer insulation film to be formed.

Alternatively, while the coolant is circulated in the transport arm 60, the top 12 may be further used to cool the substrate W. This also provides a low dielectric constant of the interlayer insulation film. Additionally, the use of both of the transport arm 60 and the top 12 for cooling can rapidly cool the substrate W to lower than the critical reaction temperature, further increasing the processing efficiency.

Moreover, the substrate processing apparatus having the heat treatment apparatus incorporated therein is not limited to that shown in FIG. 1, but may be of different constructions from that of FIG. 1, as required, in accordance with the object and contents of the overall processing. Further, the procedure in the substrate processing apparatus is not limited to that shown in FIG. 2, but may be determined, as required, in accordance with the types of the low-dielectric-constant material. For example, the preheating process in the hot plate units HP1 and HP2 may be omitted.

While the invention has been described in detail, the foregoing description is in all aspects illustrative and not restrictive. It is understood that numerous other modifications and variations can be devised without departing from the scope of the invention.

What is claimed is:

1. A heat treatment apparatus for performing heat treatment upon a substrate coated with a processing solution to form a predetermined film on said substrate, said heat treatment apparatus comprising:

a processing chamber having a low oxygen concentration atmosphere maintained therein for performing said heat treatment upon a substrate, said processing chamber having an opening;

a heater in said processing chamber for placing thereon said substrate loaded into said processing chamber to heat said substrate;

an opening/closing part for closing or opening said opening;

a loading/unloading unit movable into and out of said processing chamber for loading and unloading said substrate into and out of said processing chamber through said opening opened by said opening/closing part;

a cooling part in said loading/unloading unit for cooling said substrate held by said loading/unloading unit; and a nitrogen gas supply part for supplying nitrogen gas into said processing chamber at least when said opening/closing part opens said opening.

2. The heat treatment apparatus according to claim 1, wherein said processing chamber comprises an opening through which said substrate is loaded into and unloaded out of said processing chamber by said loading/unloading unit, said heat treatment apparatus further comprising:

an opening/closing part for closing or opening said opening; and a nitrogen gas supply part for supplying nitrogen gas into said processing chamber, wherein said nitrogen gas supply part supplies said nitrogen gas into said processing chamber at least when said opening/closing part opens said opening.

3. The heat treatment apparatus according to claim 1, wherein said opening is positioned laterally outwardly of a first end of said substrate placed on said heater, and said nitrogen gas supply part supplies said nitrogen gas into said processing chamber laterally on the side of a second end of said substrate, said second end being opposite from said first end; and wherein said nitrogen gas supply part produces a laminar flow substantially parallel to a main surface of said substrate within said processing chamber.

4. The heat treatment apparatus according to claim 3, further comprising an exhaust outlet under said opening for exhausting therethrough outside air flowing into said opening.

5. The heat treatment apparatus according to claim 4, further comprising a diffusion filter provided within said processing chamber between said second end of said substrate placed on said heater and said nitrogen gas supply part.

6. The heat treatment apparatus according to claim 5, wherein said cooling part is cooling piping through which a coolant passes.

7. The heat treatment apparatus according to claim 5, wherein said cooling part is a Peltier element.

8. The heat treatment apparatus according to claim 4, wherein said processing chamber comprises a processing chamber cooling part for cooling said substrate held by said loading/unloading unit moving into said processing chamber.

9. The heat treatment apparatus according to claim 8, wherein said processing chamber cooling part is a cooling plate.

10. The heat treatment apparatus according to claim 4, wherein, after receiving said substrate heated by said heater, said loading/unloading unit places said substrate in a standby condition within said processing chamber until the temperature of said substrate becomes lower than a predetermined temperature, and then exits from said processing chamber.

11. A substrate processing apparatus for coating a substrate with a processing solution and performing heat treatment upon said substrate to form a predetermined film on said substrate, said substrate processing apparatus comprising:

a) a coating unit for coating a substrate with said processing solution;

b) a heat treatment unit comprising:

b-1) a processing chamber having a low oxygen concentration atmosphere maintained therein for performing said heat treatment upon said substrate, said processing chamber having an opening;

b-2) a heater in said processing chamber for placing thereon said substrate loaded into said processing chamber to heat said substrate;

b-3) an opening/closing part for closing or opening said opening;

b-4) a loading/unloading unit movable into and out of said processing chamber for loading and unloading said substrate into and out of said processing chamber through said opening opened by said opening/closing part;

b-5) a cooling part in said loading/unloading unit for cooling said substrate held by said loading/unloading unit; and b-6) a nitrogen gas supply part for supplying nitrogen gas into said processing chamber at least when said opening/closing part opens said opening; and c) a transport robot for transporting said substrate between said coating unit and said heat treatment unit.

12. The substrate processing apparatus according to claim 11, wherein said processing chamber comprises an opening through which said substrate is loaded into and unloaded out of said processing chamber by said loading/unloading unit;

wherein said heat treatment unit further comprises:

an opening/closing part for closing or opening said opening; and a nitrogen gas supply part for supplying nitrogen gas into said processing chamber; and wherein said nitrogen gas supply part supplies said nitrogen gas into said processing chamber at least when said opening/closing part opens said opening.

13. The substrate processing apparatus according to claim 11, a wherein said opening is positioned laterally outwardly of a first end of said substrate placed on said heater, and said nitrogen gas supply part supplies said nitrogen gas into said processing chamber laterally on the side of a second end of said substrate, said second end being opposite from said first end; and wherein said nitrogen gas supply part produces a laminar flow substantially,parallel to a main surface of said substrate within said processing chamber.

14. The substrate processing apparatus according to claim 13, wherein said heat treatment unit further comprises an exhaust outlet under said opening for exhausting therethrough outside air flowing into said opening.

15. The substrate processing apparatus according to claim 14, wherein said processing chamber comprises a processing chamber cooling part for cooling said substrate held by said loading/unloading unit moving into said processing chamber.

16. The substrate processing apparatus according to claim 14, wherein, after receiving said substrate heated by said heater, said loading/unloading unit places said substrate in a standby condition within said processing chamber until the temperature of said substrate becomes lower than a predetermined temperature, and then exits from said processing chamber.

17. A method of performing heat treatment upon a substrate coated with a processing solution to form a predetermined film on said substrate, said method comprising the steps of:

a) continuously maintaining a low oxygen concentration atmosphere within a processing chamber for performing said heat treatment upon a substrate by supplying nitrogen gas into said processing chamber at least when an opening of said processing chamber is open;

b) heating said substrate by placing said substrate loaded into said processing chamber through said opening by a loading/unloading unit on a heater;

c) transferring said substrate heated in said step b) from said heater to said loading/unloading unit; and d) cooling said substrate transferred to said loading/unloading unit within said processing chamber by using a cooling part provided in said loading/unloading unit.

18. The method according to claim 17, wherein said processing chamber comprises an opening through which said substrate is loaded into and unloaded out of said processing chamber by said loading/unloading unit;

wherein said step a) comprises the step of a-1) supplying nitrogen gas into said processing chamber at least when said opening is open.

19. The method according to claim 17, wherein said opening is positioned laterally outwardly of a first end of said substrate placed on said heater; and wherein said step a) comprises the step of supplying said nitrogen gas into said processing chamber laterally on the side of a second end of said substrate to produce a laminar flow substantially parallel to a main surface of said substrate within said processing chamber, said second end being opposite from said first end.

20. The method according to claim 19, further comprising the step of e) placing said substrate in a standby condition within said processing chamber until the temperature of said substrate becomes lower than a predetermined temperature, and then unloading said substrate out of said processing chamber by using said loading/unloading unit.

* * * * *